(12) United States Patent
Zota et al.

(10) Patent No.: US 12,707,667 B2
(45) Date of Patent: Aug. 11, 2026

(54) HIGH ELECTRON MOBILITY TRANSISTOR WITH GATE ELECTRODE BELOW THE CHANNEL

(71) Applicant: International Business Machines Corporation, Armonk, NY (US)

(72) Inventors: Cezar Bogdan Zota, Rueschlikon (CH); Eunjung Cha, Adliswill (CH); Thomas Morf, Gross (CH); Peter Mueller, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1015 days.

(21) Appl. No.: 17/555,961

(22) Filed: Dec. 20, 2021

(65) Prior Publication Data

US 2023/0197842 A1 Jun. 22, 2023

(51) Int. Cl.
*H10D 30/47* (2025.01)
*H10D 30/01* (2025.01)

(52) U.S. Cl.
CPC ......... *H10D 30/475* (2025.01); *H10D 30/015* (2025.01)

(58) Field of Classification Search
CPC ...................... H01L 29/66462; H01L 29/7786
See application file for complete search history.

(56) References Cited

U.S. PATENT DOCUMENTS 5,296,395 A 3/1994 Khan et al.
6,350,993 B1 * 2/2002 Chu .................... H01L 29/1054 257/190
8,169,002 B2 5/2012 Chang et al.
9,608,100 B2 3/2017 Choi et al.
10,439,057 B2 10/2019 Jun et al.
10,541,315 B2 1/2020 Ye et al.
10,573,568 B2 2/2020 Prechtl et al.
10,833,163 B2 11/2020 Huang
10,868,136 B2 12/2020 Chiu et al.
12,009,414 B2 6/2024 Cha et al.
12,191,382 B2 1/2025 Zota et al.

(Continued)

FOREIGN PATENT DOCUMENTS

CN 105762078 A 7/2016
EP 0266166 B1 1/1993

OTHER PUBLICATIONS

Cha, E. et al. | "Two-Finger InP HEMT Design for Stable Cryogenic Operation of Ultra-Low-Noise Ka- and Q-Band LNAs". IEEE Transactions on Microwave Theory and Techniques, vol. 65, No. 12, Dec. 2017, 10 pages.

(Continued)

*Primary Examiner* — Mohammad M Choudhry

(74) *Attorney, Agent, or Firm* — Amin, Turocy & Watson, LLP

(57) ABSTRACT

One or more systems, devices, methods of use and/or methods of fabrication provided herein relate to a high-electron-mobility transistor with a gate electrode below the channel. According to one embodiment, a device comprises a source electrode and a drain electrode coupled to a top surface of a high-electron-mobility transistor (HEMT) heterostructure, and a gate electrode located in contact with an underside of the HEMT heterostructure.

19 Claims, 13 Drawing Sheets

(56) References Cited

U.S. PATENT DOCUMENTS

| | | | | |
|---|---|---|---|---|
| 2005/0118781 | A1* | 6/2005 | Berge | G03F 9/7003 257/797 |
| 2010/0219452 | A1 | 9/2010 | Brierley | |
| 2012/0098035 | A1* | 4/2012 | Bahl | H01L 29/7787 257/E21.403 |
| 2013/0234207 | A1* | 9/2013 | Choi | H01L 29/778 257/194 |
| 2016/0358782 | A1* | 12/2016 | Yang | H01J 37/321 |
| 2018/0005988 | A1* | 1/2018 | Deligianni | H10D 84/85 |
| 2021/0367035 | A1* | 11/2021 | Mizan | H01L 29/205 |
| 2021/0375620 | A1* | 12/2021 | Ahmed | H01L 25/50 |
| 2022/0077859 | A1* | 3/2022 | Reilly | H03K 19/1958 |

OTHER PUBLICATIONS

Cha, E. et al. | "InP HEMTs for Sub-mW Cryogenic Low-Noise Amplifiers". IEEE Electron Device Letters, vol. 41, No. 7, Jul. 2020, 4 pages.

* cited by examiner

400

HIGH ELECTRON MOBILITY TRANSISTOR WITH GATE ELECTRODE BELOW THE CHANNEL

BACKGROUND

The subject disclosure relates to low-noise amplifiers and more specifically, to a high-electron-mobility transistor (HEMT) with a gate electrode below the channel.

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1, which can entangle multiple quantum bits and can use interference. Quantum computing has the potential to solve problems that, due to computational complexity, cannot be solved or can only be solved slowly on a classical computer.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, apparatuses, and methods are described that can facilitate operation of an LNA in a quantum system with low power consumption.

According to an embodiment, a device can comprise a source electrode coupled to a top surface of a high-electron-mobility transistor (HEMT) heterostructure, and a gate electrode located in contact with an underside of the HEMT heterostructure. An advantage of such a device is that it can operate as a high-electron-mobility transistor for use in an LNA that is optimized to operate with minimal degradation of noise temperature when operated at low power. That is, by coupling the source electrode and drain electrode on the top surface of the HEMT heterostructure and placing the gate electrode on an underside of the HEMT heterostructure, access resistance and parasitic capacitance of the HEMT is reduced in comparison to traditional HEMT structures, thereby decreasing the degradation of the noise temperature of the signal amplified by the LNA. As a result, of one or more of these advantages, operation of the device in a quantum system can lead to less power draw, and thus less waste heat due to power draw, enabling greater scalability of quantum systems within the confines of the limits of cryogenic cooling technology.

In some embodiments of the above described device, the gate electrode is coupled to an encapsulated electrical interconnect and the encapsulated electrical interconnect is coupled to a gate pad. An advantage of such a device is that the gate pad and the encapsulated electrical interconnect can be used to operate an encapsulated gate electrode.

According to another embodiment, a method can comprise coupling a source electrode and a drain electrode to a top surface of a high-electron-mobility transistor (HEMT) heterostructure and positioning a gate electrode in contact with an underside of the HEMT heterostructure. An advantage of such a method is that it can produce a device which can operate as a high-electron-mobility transistor for use in an LNA that is optimized to operate with minimal degradation of noise temperature when operated at low power.

Some embodiments of the above described method can further comprise coupling an electrical interconnect to the gate electrode, wherein the electrical interconnect and the gate electrode are encapsulated, and coupling a gate pad to the electrical interconnect. An advantage of such a method is that it can produce a device in which the gate pad and the encapsulated electrical interconnect can be used to operate an encapsulated gate electrode.

In another embodiment, a device can comprise a gate electrode, and a semiconductor structure comprising a barrier region on top of the gate electrode, a channel region configured to carry a current on top of the barrier region, and a source electrode and a drain electron located on top of the channel region. An advantage of such devices and/or methods can be a high-electron-mobility transistor for use in an LNA that is optimized to operate with minimal degradation of noise temperature with low power.

In some embodiments of the above described device, the gate electrode is coupled to an encapsulated electrical interconnect and the encapsulated electrical interconnect is coupled to a gate pad. An advantage of such a device is that the gate pad and the encapsulated electrical interconnect can be used to operate an encapsulated gate electrode.

DETAILED DESCRIPTION

Figure 1:
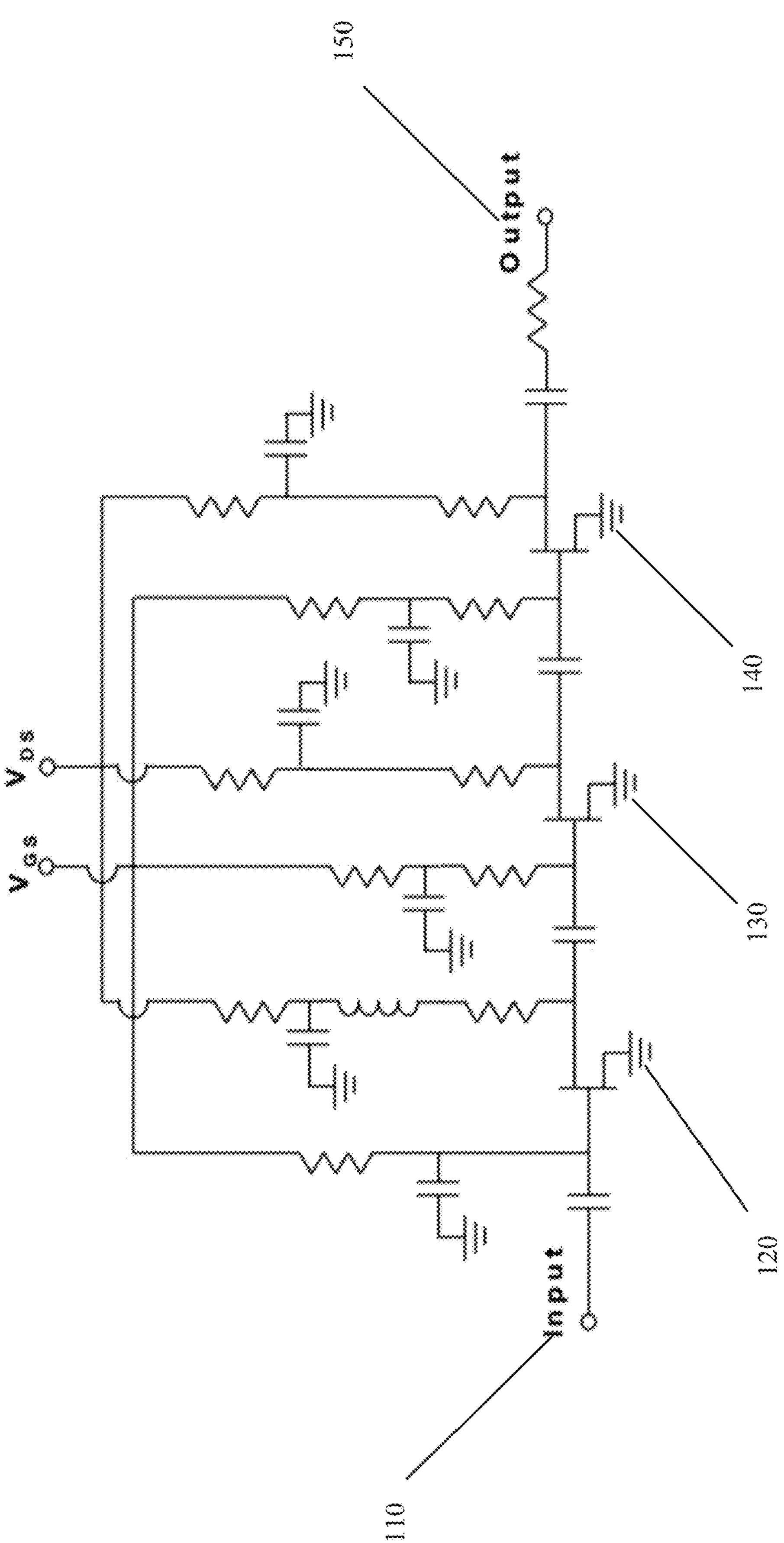
FIG. 1 illustrates a diagram of an example, non-limiting low-noise amplifier device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

The readout signals from qubits in quantum computers are typically very low power due to the need to keep superconducting qubits at very low temperatures. As such, low-noise amplifiers (LNA) are used in order to amplify the readout signals from qubits as part of the read out process. As part of the amplification process, LNAs add some additional noise, known as noise temperature, to the amplified signal. LNAs typically have a large power consumption. This large power consumption leads to excess heat that in turn can negatively impact quantum computing systems by raising the temperature of the system and the qubits within, thereby impacting accuracy and speed of the quantum computer. This has a large impact on limiting the scalability of quantum computers. For example, a 1000 qubit system will use at least 100 LNAs as part of the readout path. This number of LNAs use enough power to create enough waste heat to overcome the ability of cryogenic systems to keep quantum computing systems cold. While LNAs can operate at low power levels, this causes degradation of the noise temperature of the amplified signal due to the gain of an active component in LNA decreasing due to the decreased power consumption. As such, this causes a trade-off between the power consumption and the noise properties of existing LNA designs. An approach to overcoming this tradeoff is to optimize LNAs to minimize access resistance and total gate capacitances in order to improve noise characteristics of the LNA. However existing LNA and transistor designs make this minimization difficult due to the placement of the gate in relation to the channel and the contacts.

In view of the aforementioned one or more problems with current approaches and or devices employed in amplifying readout signals in quantum systems, and particularly relative to LNAs, it can be desired to improve upon reduction of access resistance and parasitic capacitance of LNAs. To that end, the described subject matter can employ various techniques to minimize access capacitance and parasitic capacitance in order to enable LNAs to operate at lower power levels.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it will be appreciated that the embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning now to FIG. 1, an LNA is illustrated. Generally, the LNA 100 can comprise an input line 110, an output line 150, one or more transistors, such as transistor 120, transistor 130, and/or transistor 140 and additional passive components. In an embodiment, transistors 120, 130, and/or 140 can be a high-electron-mobility transistor (HEMT). LNA 100 can receive and input signal (e.g., via input line 110) and amplify the input signal using transistors 120, 130, and/or 140. LNA 100 can then output the amplified signal (e.g., via output line 150). HEMT transistors are able to operate at higher frequencies than traditional transistors, in some cases up to millimeter wave frequencies, and thus offer better performance in LNAs in quantum systems in comparison to traditional transistors. However, as described above, HEMTs have a high-power draw, which leads to waste heat, and in turn limits the scalability of quantum systems due to the limitations of the cryogenic technology used to keep qubits cool.

Figure 2:
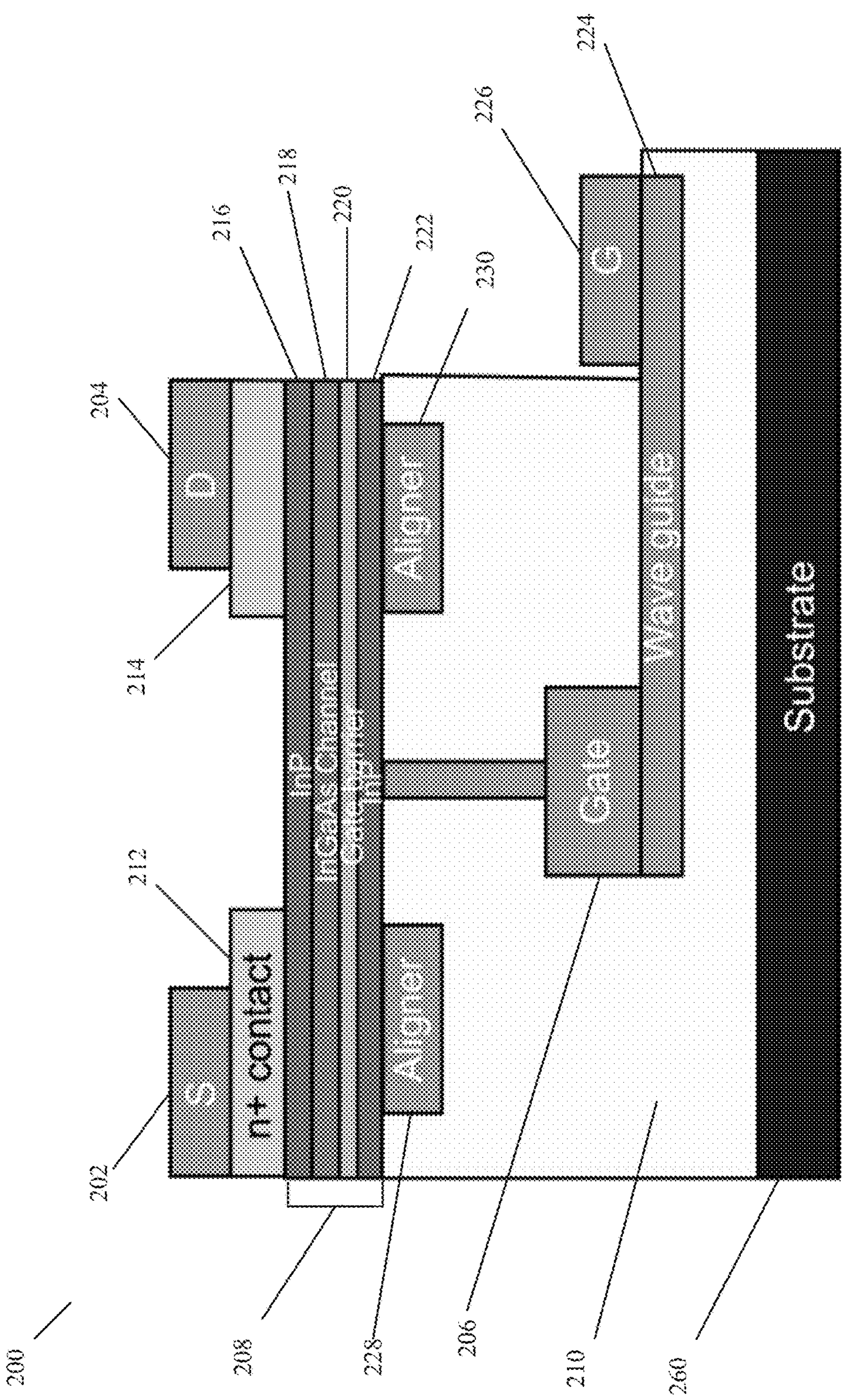
FIG. 2 illustrates a cross-section of a device in accordance with one or more embodiments described herein.

Turing now to FIG. 2, an HEMT device of an LNA is illustrated in cross-section. Generally, the device 200, a transistor device 200, can comprise a source electrode and drain electrode coupled to a top surface of a high-electron-mobility transistor (HEMT) heterostructure, and a gate electrode located in contact with an underside of the HEMT heterostructure. Put another way, device 200 can comprise source and drain electrodes above a channel layer of a HEMT heterostructure and a gate electrode below the channel layer of the HEMT heterostructure. In an embodiment, the HEMT heterostructure can comprise a first plurality of semiconductor layers, a contact layer adjacent to the first plurality of semiconductor layers, an intermediate semiconductor layer adjacent to the contact layer, and a second plurality of semiconductor layers adjacent to the channel layer. In a further embodiment, the second plurality of semiconductor layers can comprise a gate barrier layer and a semiconductor layer adjacent to the gate barrier layer. In another embodiment, transistor device 200 can comprise a gate electrode and a semiconductor region comprising a barrier region on top of that gate electrode, a channel region configured to carry an electrical current on top of the barrier region, and a source electrode and a drain electrode located on top of the channel region.

As illustrated, device 200 comprises a source electrode 202, a drain electrode 204, a gate electrode 206, and a HEMT heterostructure 208. Surrounding gate electrode 206 is an oxide layer 210. Oxide layer 210 can comprise a material such as silicon oxide, or another suitable material that can be deposited by oxide deposition and/or chemical vapor deposition. Oxide layer 210 can reside on substrate 260. As illustrated, HEMT heterostructure 208 comprises contacts 212 and 214, semiconductor layer 216, channel layer 218, gate barrier layer 220, and semiconductor layer 222. In an embodiment, semiconductor layer 216 and/or semiconductor layer 222 can comprise an indium phosphide binary semiconductor, or another suitable semiconductor material. Gate electrode 206 can be coupled to encapsulated electrical interconnect 224 that can be coupled to gate pad 226. In an embodiment, electrical interconnect 224 can be of any form that allows an electrical connection between gate electrode 206 and gate pad 226 such as a wire, a metallic connector, a wave guide, and/or another suitable material or form. Source electrode 202, drain electrode 204, gate electrode 206, and gate pad 226 can comprise a material such as copper, brass, titanium, gold, platinum, a metallic element, a metal alloy, and/or another material with suitable electrical conductivity. As illustrated, device 200 additionally comprises alignment markers 228 and 230 which are used during manufacture in order to properly align source electrode 202 and drain electrode 204.

It should be appreciated that by placing the source electrode 202 and drain electrode 204 above channel layer 218 and gate electrode 206 below channel layer 218, both the access resistance and parasitic capacitance of device 200 can be greatly reduced. For example, resistance access can be defined as $R_{access}=R_c+R_{sh}+R_{barrier}+R_{side}$ wherein $R_c$ is the resistance between a drain electrode and the contact layer, $R_{sh}$ is the resistance from the contact layer, $R_{barrier}$ is the resistance from the barrier layer, and $R_{side}$ is the resistance from the channel underneath the gate recess. Typically, resistance from the drain electrode causes approximately 15% of the access resistance, resistance from the contact layer causes approximately 15% of the access resistance, resistance from the layer underneath the gate recess causes approximately 10% of the access resistance, and resistance from the barrier causes approximately 60% of the access resistance. As such, resistance from the barrier accounts for the majority of access resistance, and lowering it has a large impact on total access resistance. In turn, barrier resistance is largely due to the placement of the barrier layer between the contact layer and the channel layer in traditional HEMT heterostructures. Total gate capacitance can be defined as $C_{total}=C_G+C_{GS,par}+C_{CD,par}$ wherein $C_g$ is the intrinsic gate capacitance which controls the channel layer and $C_{GS,par}$ and $C_{CD,par}$ are the parasitic capacitance between the gate electrode and the source and drain electrodes respectively. Typically, the parasitic capacitance between the gate electrode and the source and drain electrodes causes approximately 50% of the total gate capacitance. As such, it is clear that resistance from the barrier layer and parasitic capacitance between the gate electrode and the source and drain electrodes are the primary bottlenecks in optimizing LNAs to operate at lower power levels with minimized degradation of the noise temperature.

Parasitic capacitance is caused by electrical conductors operating at different frequencies in close proximity to one and other. The structure of device 200 greatly decreases parasitic capacitance through its positioning of the gate electrode. For example, by placing gate electrode 206 underneath source electrode 202 and drain electrode 204, parasitic capacitance between the electrodes is reduced due to increased distance between the electrodes. Additionally, by encapsulating gate electrode 206 in oxide layer 210 parasitic capacitance is reduced further. Furthermore, as barrier layer 220 is underneath channel layer 218, there is no barrier layer between channel layer 218 and contact 212 and 214, thereby greatly reducing access resistance. As such, it should be appreciated that the structure of device 200 offers significant reduction in access resistance and total gate capacitance in comparison to traditional transistors, and thus lowering noise temperature degradation and thus improving performance with a low power draw.

Turning next to FIGS. 3-12, these figures illustrate device 200 at various stages of manufacture. The stages 300-1200 comprise many of the same features as device 200.

Figure 3:
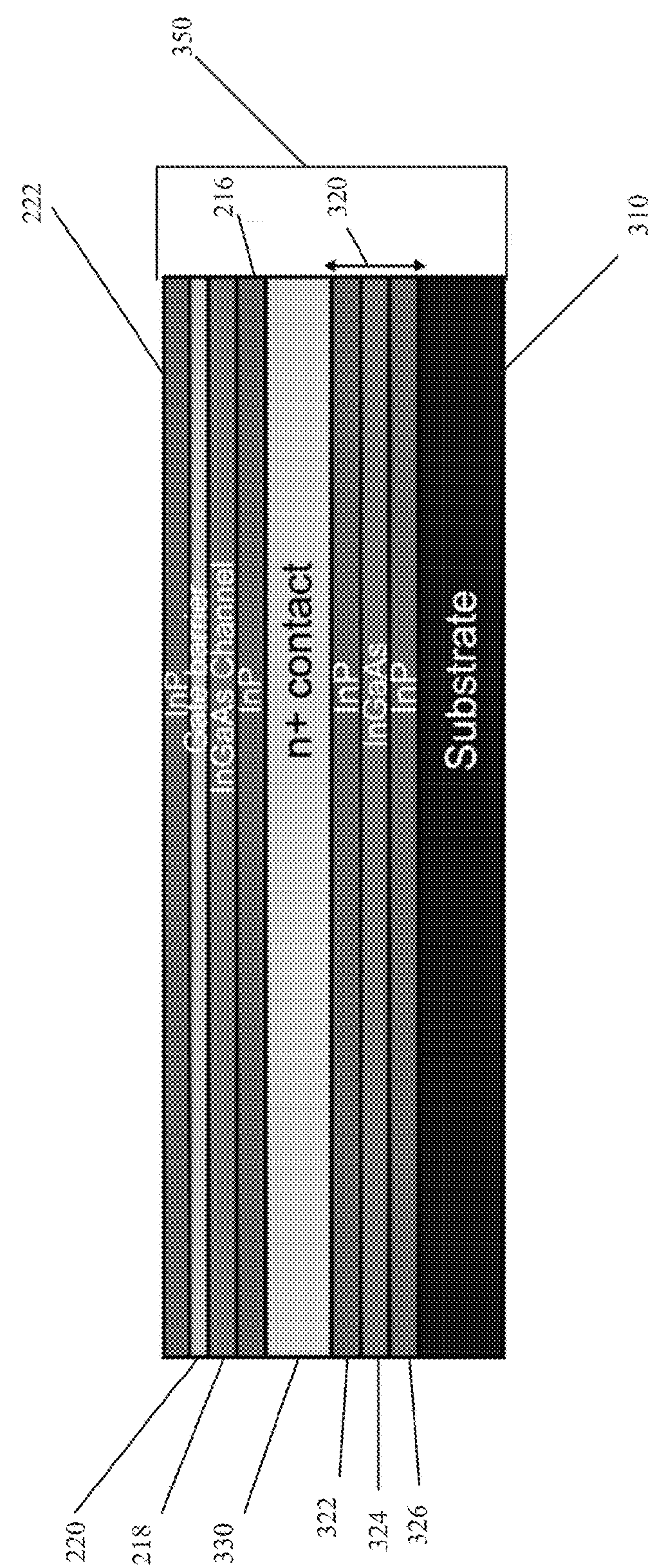
FIG. 3 illustrates a cross-section of a device at an intermediate stage of manufacture in accordance with one or more embodiments described herein.

At FIG. 3, stage 300 of device 200 has a starting heterostructure 350. Starting heterostructure 350 can comprise substrate layer 310, etch-stop layers 320, contact layer 330, semiconductor layer 216, channel layer 218, gate barrier layer 220, and/or semiconductor layer 222. Additionally, etch-stop layers 320 can comprise semiconductor layers 322, 324, and 326. Semiconductor layers 216, 222, 322, 324, and 326 can comprise an indium phosphide binary semiconductor, or any other suitable semiconductor material. As the purpose of etch-stop layers 320 is to protect contact layer 330 during manufacture, etch-stop layers 320 can comprise a material such as an indium aluminum arsenide alloy. It should be appreciated that the layers of stage 300 of device 200 can be assemble through a process such as direct wafer bonding and/or another suitable process. It should be further appreciated that contact layer 330 is underneath channel layer 218.

Figure 4:
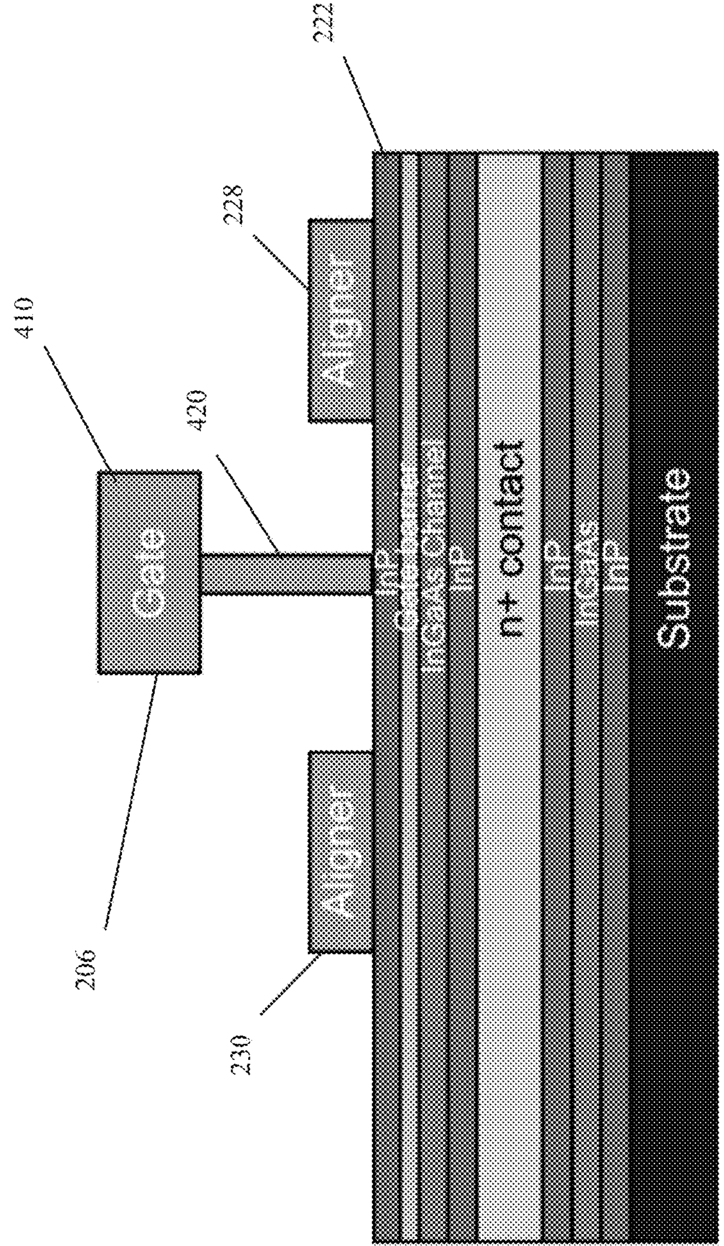
FIG. 4 illustrates a cross-section of a device at an intermediate stage of manufacture in accordance with one or more embodiments described herein.

At FIG. 4, stage 400 of device 200 additionally comprises gate electrode 206 attached to semiconductor layer 222. Gate electrode 206 can be formed and attached to semiconductor layer using a standard triple-layer resist process. In an embodiment, gate electrode 206 can be a T-gate formation comprising an upper portion 410 and a lower portion 420. In an additional embodiment, alignment markers 228 and 230 can be placed on semiconductor layer 222 and either side of gate electrode 206. Alignment markers 230 and 228 can allow for more accurate placement of the source electrode 202 and drain electrode 204 during manufacture. It should be appreciated that alignment markers 228 and 230 are optional and, in an embodiment can be left out of stage 400. Additionally, in an embodiment, alignment markers 228 and 230 can be placed not in contact with semiconductor layer 222. For example, a thin oxide layer (not shown) can be deposited on semiconductor layer 222 with alignment markers 228 and 230 being placed on the thin oxide layer.

Figure 5:
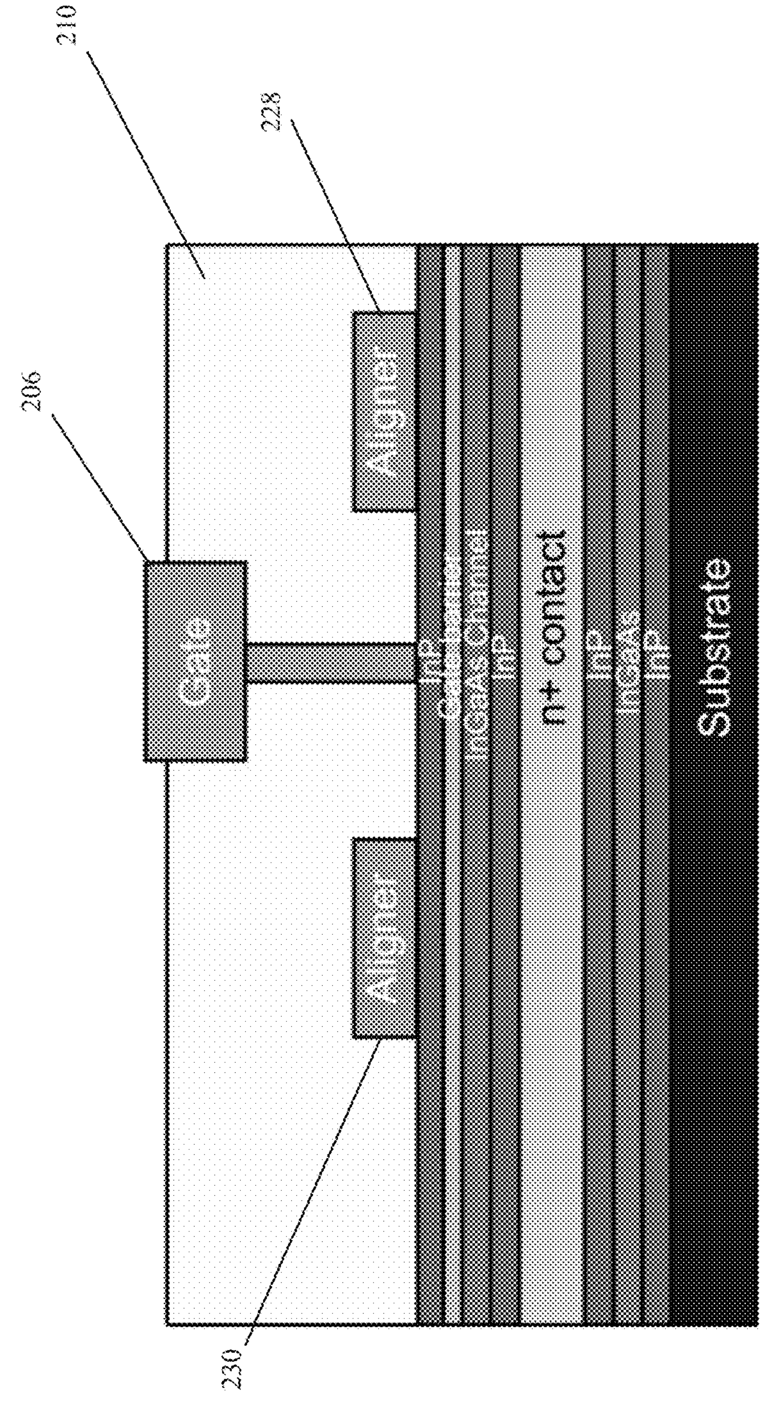
FIG. 5 illustrates a cross-section of a device at an intermediate stage of manufacture in accordance with one or more embodiments described herein.

At FIG. 5, stage 500 of device 200 additionally comprises oxide layer 210 surrounding alignment markers, 228 and 230 and gate electrode 206. Oxide layer 210 can be deposited through a process such as chemical vapor deposition or oxide deposition. In an embodiment, oxide layer 210 can encapsulate the entirety of gate electrode 206. The top surface of gate electrode 206 can be exposed through the use of chemical-mechanical planarization and wet etching to facilitate further stages of manufacture.

Figure 6:
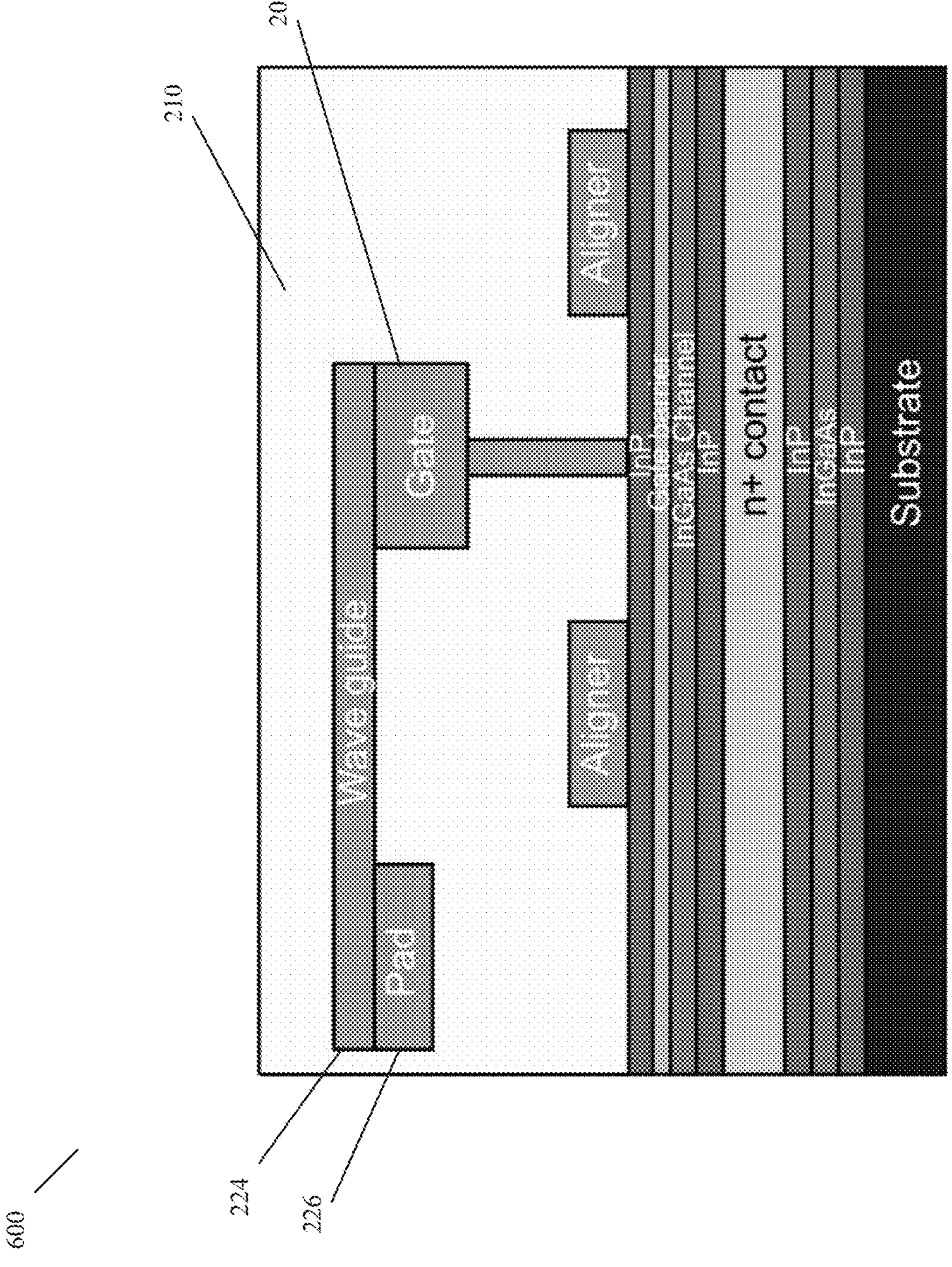
FIG. 6 illustrates a cross-section of a device at an intermediate stage of manufacture in accordance with one or more embodiments described herein.

At FIG. 6, stage 600 of device 200 additionally comprises electrical interconnect 224 and gate pad 226. In an embodiment, electrical interconnect 224 and gate pad 226 can be attached to gate electrode 206 through a metallization process in order to couple electrical interconnect 224 to gate electrode 206. In an embodiment, gate pad 226 can be coupled to electrical interconnect 224 through a metallization process. In another embodiment, gate pad 226 can be included at a later stage of manufacture as opposed to stage 600. After electrical interconnect 224 is coupled to gate electrode 206, an oxide deposition or chemical vapor deposition process can be used to expand oxide layer 210 to fully encapsulate gate electrode 206, electrical interconnect 224, and/or gate pad 226.

Figure 7:
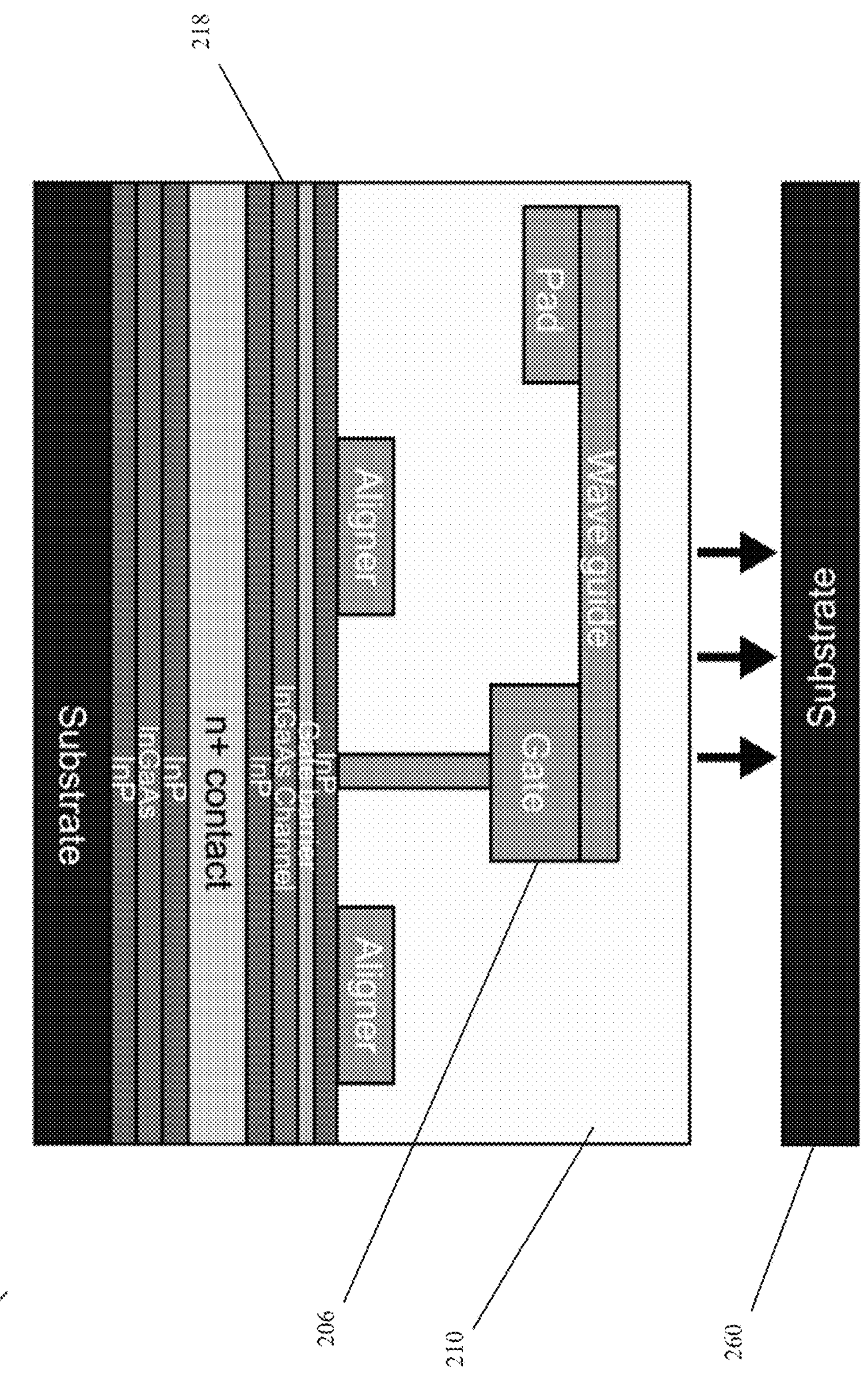
FIG. 7 illustrates a cross-section of a device at an intermediate stage of manufacture in accordance with one or more embodiments described herein.

At FIG. 7, stage 700 of device 200 comprises device 200 being flipped over and oxide layer 210 can be attached to substrate 260 through a process such as direct wafer bonding. It should be appreciated that by flipping stage 700 of device 200, gate electrode 206 is beneath channel layer 218. As described above in refence to FIG. 2, by placing gate electrode 206 beneath channel layer 218, access resistance and parasitic capacitance of device 200 can be greatly reduced, thereby improving the low power performance of device 200.

Figure 8:
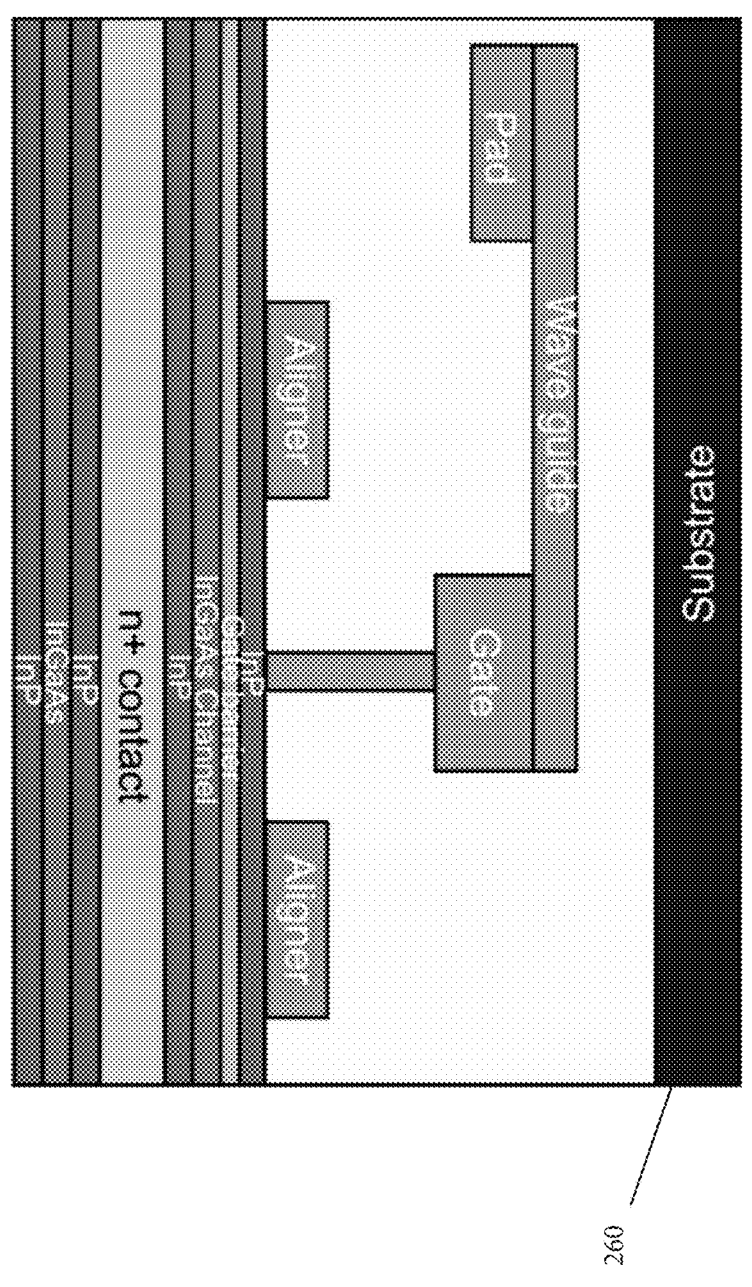
FIG. 8 illustrates a cross-section of a device at an intermediate stage of manufacture in accordance with one or more embodiments described herein.

At FIG. 8, stage 800 of device 200 comprises substrate layer 310 being removed from stage 800. As substrate 260 was added in stage 700, substrate 310 is no longer used and can be removed to facilitate further manufacture of device 200. Substrate 310 can be removed through a process such as wafer release, chemical-manufacture planarization, water etching, or a suitable grinding process.

Figure 9:
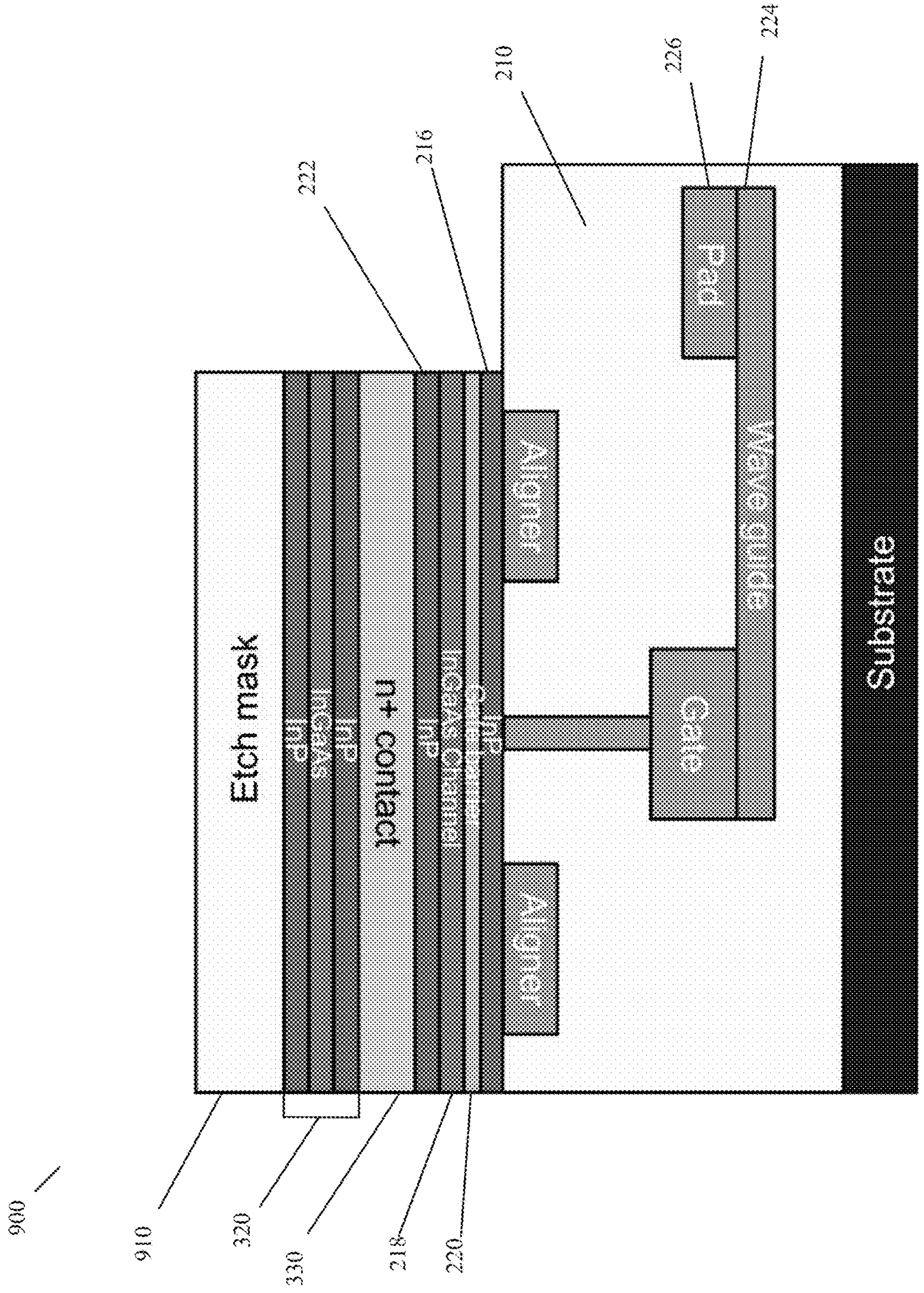
FIG. 9 illustrates a cross-section of a device at an intermediate stage of manufacture in accordance with one or more embodiments described herein.

At FIG. 9, stage 900 of device 200 comprises an etch mask 910 that is applied over a portion of etch-stop layer 320. The portions of etch-stop layers 320, contact layer 330, semiconductor layer 216, channel layer 218, barrier layer 220, semiconductor layer 222 and oxide layer 210 not covered by etch mask 910 can be etched through to expose gate pad 226 and/or a portion of electrical interconnect 224. For example, if gate pad 226 was added at stage 700, the etching can expose a portion of gate pad 226. If gate pad 226, was not added at stage 700, then the etching can expose a portion of electrical interconnect 224 and gate pad 226 can be coupled to electrical interconnect 224. The etching process used at stage 900 can comprise wet etching, plasma etching, or another suitable etching process. As such, the material of etch mask 910 can differ depending on the type of etching process in order to facilitate better protection of the layers underneath etch mask 910.

Figure 10:
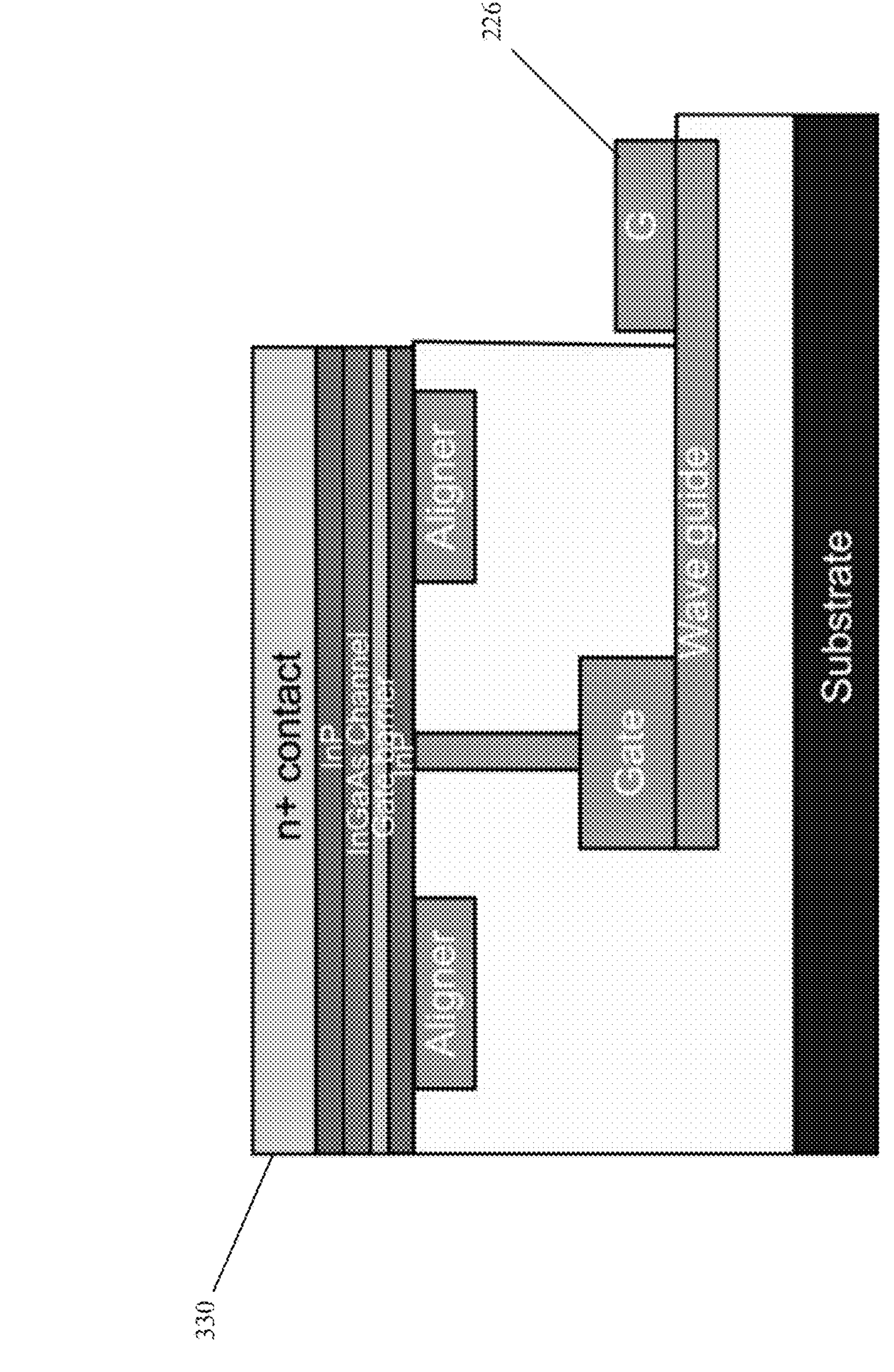
FIG. 10 illustrates a cross-section of a device at an intermediate stage of manufacture in accordance with one or more embodiments described herein.

At FIG. 10, stage 1000 of device 200 comprise removing etch mask 910 and removing etch-stop layers 320. As the purpose of etch-stop layers 320 was to protect contact layer 330 during the etching process in stage 900, etch-stop layers 320 can be removed using a process such as direct wafer release in order to expose contact layer 330. It should be appreciated that in stage 1000 gate pad 226 is exposed due to the etching process of stage 900.

Figure 11:
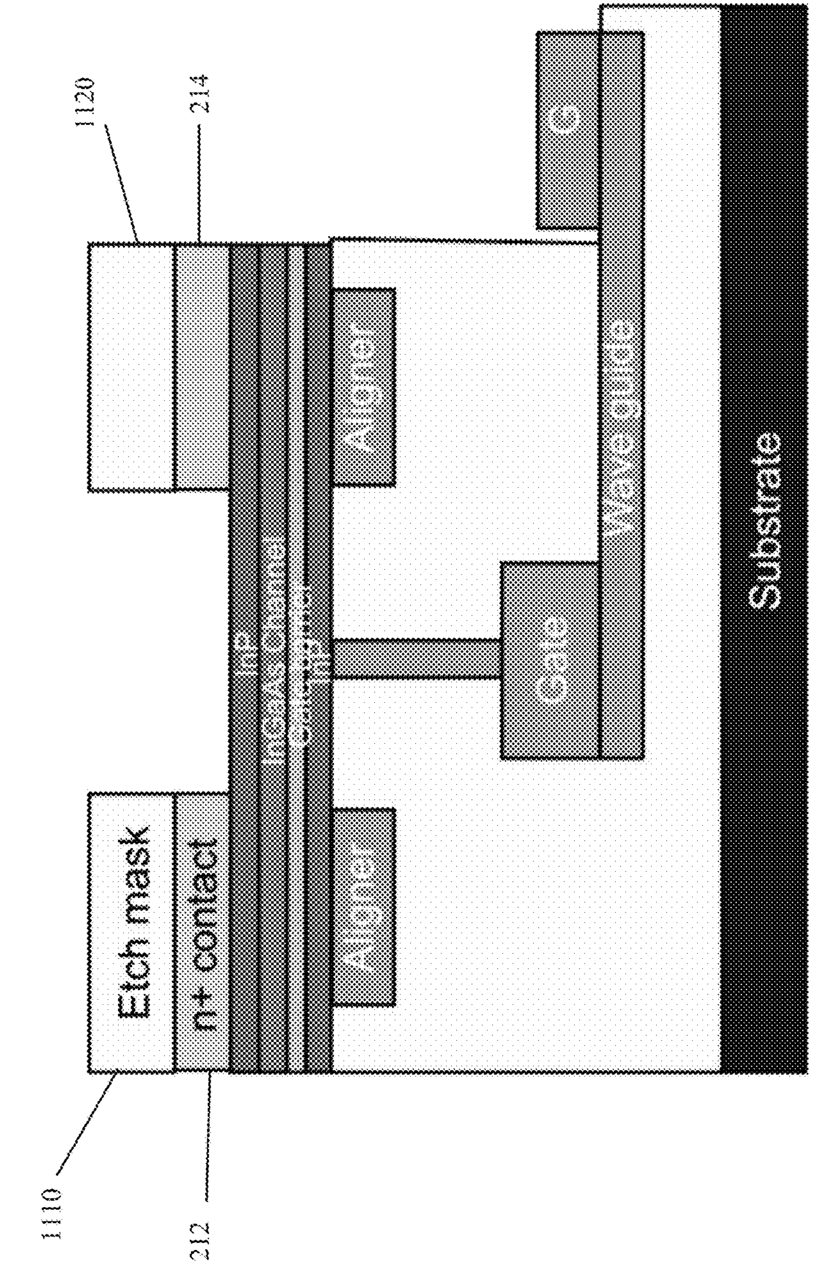
FIG. 11 illustrates a cross-section of a device at an intermediate stage of manufacture in accordance with one or more embodiments described herein.

At FIG. 11, stage 1100 of device 200 additionally comprises etch mask 1110 and etch mask 1120, which can be placed on the edges of contact layer 330 in order to protect the regions of contact layer 330 where source electrode 202 and drain electrode 204 will be located. An etching process, such as those discussed above, can be used to remove the center portion of contact layer 330, to create contacts 212 and 214 and to define a back-side channel region.

Figure 12:
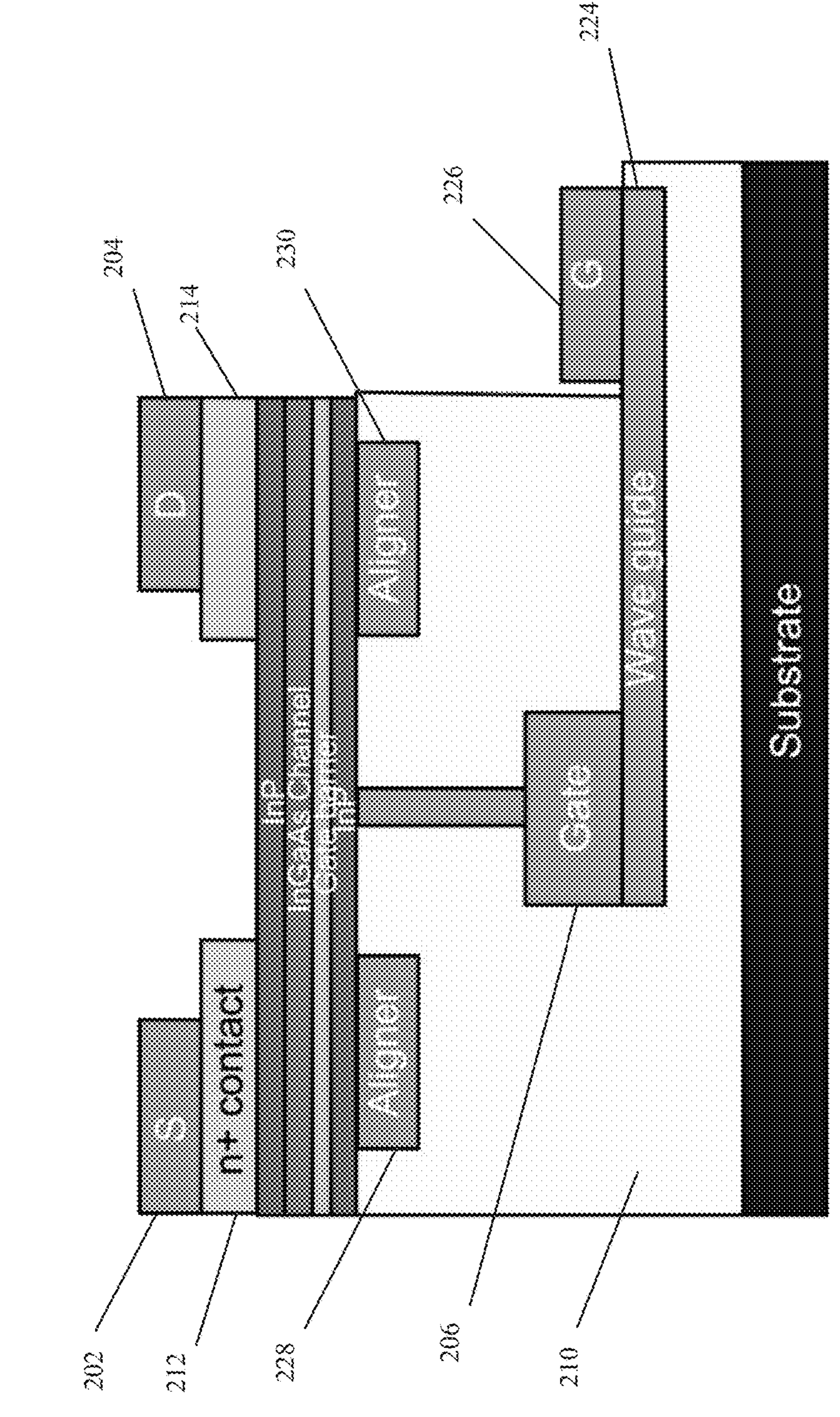
FIG. 12 a cross-section of a device at an intermediate stage of manufacture in accordance with one or more embodiments described herein.

At FIG. 12, stage 1200 of device 200 comprises source electrode 202 and drain electrode 204. After the etching of stage 1200, etch masks 1110 and 1120 can be removed to expose contacts 212 and 214. Source electrode 202 and drain electrode 204 can be coupled to contact 212 and contact 214 respectively through a metallization process. It should be appreciated that at stage 1200 device 200 is complete. Additionally, it should be appreciated that as gate electrode 206 is located below channel layer 218 and source electrode 202 and drain electrode 204 are above channel layer 218, access resistance and parasitic capacitance of device 200 are reduced, thereby improving device 200's performance at low power levels as described above. Furthermore, it should be appreciated that exposed gate pad 226 and electrical interconnect 224 allow for operation of gate electrode 206 despite gate electrode 206 being encapsulated in oxide layer 210.

Figure 13:
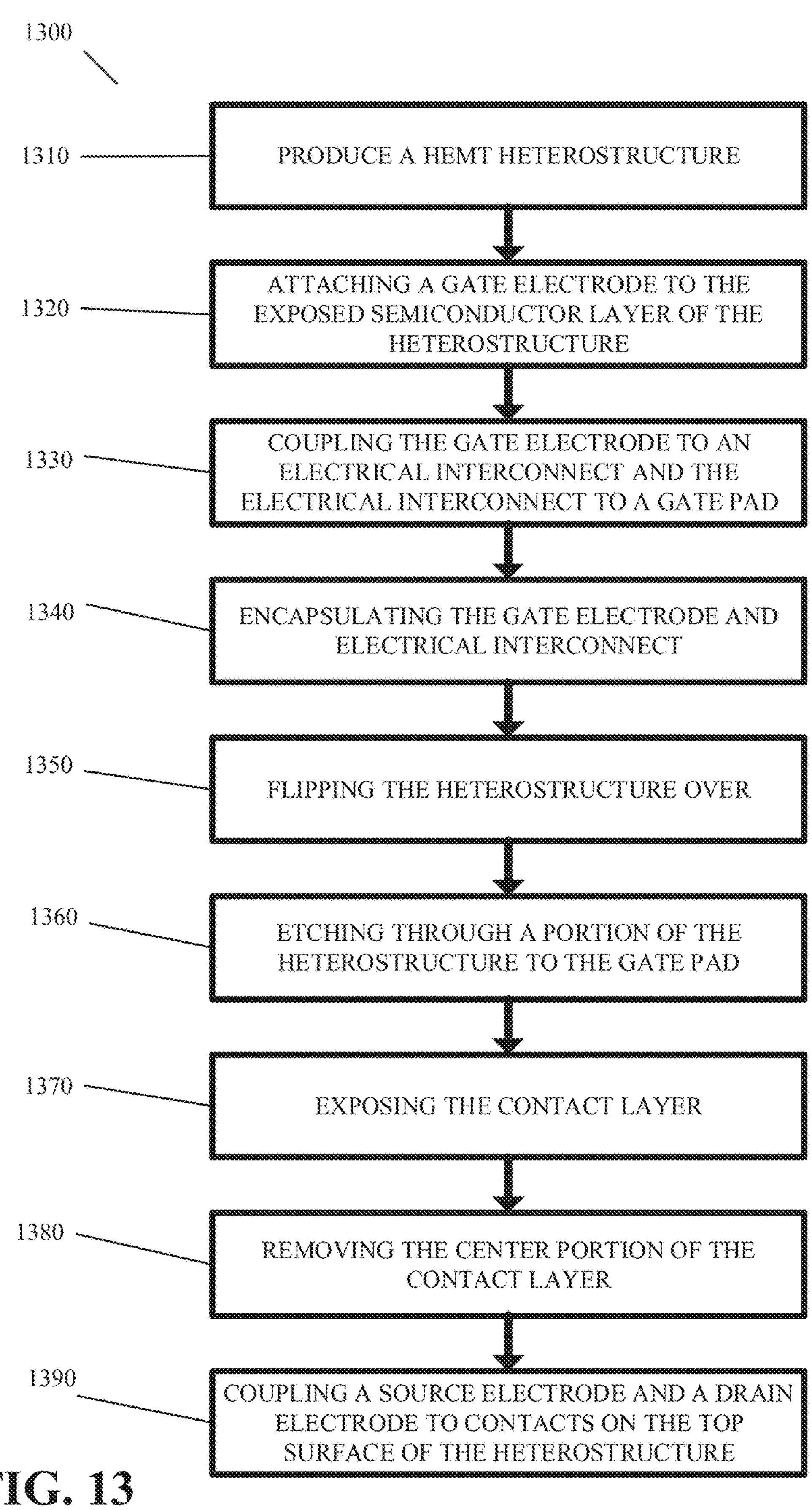
FIG. 13 illustrates a flow diagram of an example, non-limiting method that can facilitate a process to fabricate a device constructed in accordance with one or more embodiments described herein.

FIG. 13 illustrates a flow diagram of an example, non-limiting method 1300 that can facilitate a process to fabricate a device constructed in accordance with one or more embodiments described herein. Repetitive description of like elements and/or processes employed in respective embodiments is omitted for sake of brevity.

At 1310, the method 1300 can comprise producing a HEMT heterostructure (e.g., starting heterostructure 350). For example, as described above in reference to FIG. 3, starting heterostructure 350 can comprise etch-stop layers 320, a contact layer 330, semiconductor layer 216, channel layer 218, gate barrier layer 220, and semiconductor layer 222. Additionally, etch-stop layers 320 can comprise semiconductor layers 322, 324, and 326. In an embodiment, semiconductor layers 216, 222, 322, 324, and 326 can comprise an indium phosphide binary semiconductor, an indium gallium arsenide alloy semiconductor, or any other suitable semiconductor material. In an example, starting heterostructure 350 can be produced through a process such as direct wafer bonding to bond the layers of starting heterostructure 350 together. It should be appreciated that any HEMT heterostructure comprising a series of etch-stop layers, such as etch-stop layers 320, can be used as starting heterostructure 350.

At 1320, the method 1300 can comprise attaching a gate electrode (e.g., gate electrode 206) to the exposed semiconductor layer of the heterostructure (e.g., semiconductor layer 222). For example, as described above in reference to FIGS. 3-13, gate electrode 206 can be a T-gate formation electrode comprising an upper and lower portion and attached to semiconductor layer 222 through a standard triple-layer resist process. In an embodiment, at 1320, the method 1300 can additionally comprise positioning of alignment markers (e.g., alignment markers 228 and 230) on the exposed semiconductor layer (e.g., semiconductor layer 222) on either side of the gate electrode (e.g., gate electrode 206). In another embodiment, at 1320, method 1300 can comprise depositing a thin oxide layer on the exposed semiconductor layer (e.g., semiconductor layer 222) and positing alignment markers (e.g., alignment markers 228 and 230) on the thin oxide layer.

At 1330, the method 1300 can comprise coupling the gate electrode (e.g., gate electrode 206) to an electrical interconnect (e.g., electrical interconnect 224) and coupling the electrical interconnect (e.g., electrical interconnect 224) to a gate pad (e.g., gate pad 226). For example, as described above in reference to FIGS. 3-12, an oxide layer (e.g., oxide layer 210) can be deposited through a chemical vapor deposition process to encapsulate the gate electrode (e.g., gate electrode 206). A surface of the gate electrode (e.g., gate electrode 206) can be exposed through a process of chemical-mechanical planarization and/or wet etching. The electrical interconnect (e.g., electrical interconnect 224) can be coupled to the surface of the gate electrode (e.g., gate electrode 226) through a metallization process at one end. A gate pad (e.g., gate pad 226) can be coupled to the other end of the electrical interconnect (e.g., electrical interconnect 224) through a metallization process. In another embodiment, the gate pad (e.g., gate pad 226) can be coupled to the electrical interconnect (electrical interconnect 224) at a later step.

At 1340, the method 1300 can comprise encapsulating the gate electrode (e.g., gate electrode 206) and the electrical interconnect (e.g., electrical interconnect 224) in an oxide layer (e.g., oxide layer 210). For example, as described above in reference to FIGS. 3-12, after the electrical interconnect (e.g., electrical interconnect 224) is coupled to the gate electrode (e.g., gate electrode 206), the oxide layer (e.g., oxide layer 210) can be expanded through the use of a chemical vapor deposition process to encapsulate the entirety of the gate electrode (e.g., gate electrode 206) and the electrical interconnect (e.g., 224). In an embodiment, if the gate pad (e.g., gate pad 226) was coupled to the electrical interconnect (e.g., electrical interconnect 224) at 1330 of the method 1300, then the gate pad (e.g., gate pad 226) can also be encapsulated in the oxide layer (e.g., oxide layer 210).

At 1350, the method 1300 can comprise flipping the starting heterostructure (e.g., heterostructure 350) over on to a second substrate (e.g., substrate 260) and removing the original substrate (e.g., substrate 310). For example, as described in reference to FIGS. 3-12, the starting heterostructure (e.g., heterostructure 350) can be flipped on to a second substrate (e.g., substrate 260) and bonded to the second substrate through a direct wafer bonding technique. The original substrate (e.g., substrate 310) can be removed through a process such as wafer release. It should be appreciated that after flipping the heterostructure (e.g., heterostructure 350), the gate electrode (e.g., gate electrode 206) is located in contact with what is now the underside of the heterostructure (e.g., semiconductor layer 222).

At 1360, the method 1300 can comprise etching through a portion of the heterostructure (e.g., heterostructure 350) to the gate pad (e.g., gate pad 226). For example, as described in reference to FIGS. 3-12, an etch mask (e.g., etch mask 910) can be placed over a portion of the heterostructure (e.g., heterostructure 350) and then an etching process can be used to etch through the heterostructure (e.g., heterostructure 350) portion not covered by the etch mask and the oxide layer (e.g., oxide layer 210) to reach the gate pad (e.g., gate pad 226). In an embodiment, if the gate pad (e.g., gate pad 226) was not coupled to the electrical interconnect (e.g., electrical interconnect 224) at 1330, step 1360 can additionally comprise etching to reach the electrical interconnect (e.g., electrical interconnect 224) and the gate pad (e.g., gate pad 226) can be coupled to the electrical interconnect through a metallization process.

At 1370, the method 1300 can comprise exposing the contact layer (e.g., contact layer 330). For example, as described in reference to FIGS. 3-12, the etch mask (e.g., etch mask 910) can be removed through a process such as direct wafer release. The layers of the heterostructure above the contact layer (e.g., etch stop layer 320) can be removed through processes such as direct wafer release and/or an etching or grinding process. As the purpose of etch stop layers 320 was to protect the contact layer (e.g., contact layer 330) up to this point in fabrication, they can now be removed to facilitate further steps in fabrication.

At 1380, the method 1300 can comprise removing the center of the contact layer (e.g., contact layer 330). For example, as described in reference to FIGS. 3-12, etch masks (e.g., etch masks 1110 and 1120) can be placed on the edges of the contact layer (e.g., contact layer 330) based on the positioning of the alignment markers (e.g., alignment markers 228 and 230). The center of the contact layer can then be removed through an etching process in order to create two contacts (e.g., contacts 313 and 214).

At 1390, the method 1300 can comprise coupling a source electrode (e.g., source electrode 202) and a drain electrode (e.g., drain electrode 204) to the contacts (e.g., contacts 313 and 214) on the top surface of the heterostructure (e.g., heterostructure 350). For example, as described above in reference to FIGS. 3-12, the contact etch masks (e.g., etch masks 1110 and 1120) can be removed and the source electrode (e.g., source electrode 202) can be coupled to one of the contacts (e.g., contact 212) through a metallization process and the drain electrode (drain electrode 204) can be coupled to one of the contacts (e.g., contact 214) through a metallization process.

An advantage of such a method is that a device produced by such a method offers decreased degradation of noise temperature when operated at low power levels. As described above, the main bottlenecks to improving noise characteristics of LNA transistors when operated at low power levels are access resistance and parasitic resistance. Access resistance is largely derived from a barrier layer between the contact layer and the channel layer as in traditional HEMT heterostructures. As such, by placing the barrier layer underneath the channel layer, there is no barrier layer between the contact layer and the channel, thus reducing access resistance. Furthermore, parasitic capacitance in HEMTs is in large part caused by parasitic capacitance between the gate electrode and the source and drain electrodes. By placing the gate electrode on the underside of the HEMT heterostructure, and thus farther away from the source and drain electrodes, parasitic capacitance is reduced. As such, the method described above can be used to produce an HEMT that offers improve noise characteristics, and thus better performance at low power levels. By improving performance at low power levels, a larger number of LNAs can be included in a quantum system as each LNA produces less waste heat, enabling a larger number of qubits in the quantum system and increased scalability. Additionally, by improving performance at low power levels, an LNA can be operated with a lower power draw, thereby reducing the cost of operating the LNA due to lower overall power consumption.

In view of one or more embodiments described herein, a practical application of the devices described herein is high performance of such devices at low power levels. This is a useful and practical application as low power use decreases overall waste heat in a quantum system, which puts less strain on cryogenics to keep the quantum system cold. This facilitates including a greater number of qubits in a quantum system and thus an improvement in the processing capacity, speed, and/or accuracy of the quantum system.

Furthermore, one or more embodiments described herein can be employed in a real-world system based on the disclosed teachings. For example, one or more embodiments described herein can function within a system that can receive as input a quantum job request and can generate as a real-world physical pulse operated on one or more qubits of a quantum system. The output signal of one or more physical qubit devices can be read and amplified by a device according to one or more embodiments described herein. The respective quantum system can generate one or more quantum results in response to the performance of the one or more physical operations on the real-world qubits of the quantum system.

The systems and/or devices have been (and/or will be further) described herein with respect to interaction between one or more components. It should be appreciated that such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

It also is to be appreciated that one or more embodiments described herein can employ hardware to solve problems that are highly technical, that are not abstract, and that cannot be performed as a set of mental acts by a human. For example, a human, or even thousands of humans, cannot efficiently, accurately and/or effectively amplify a readout signal from a quantum computer.

One or more embodiments described herein can be fully operational towards performing one or more other functions (e.g., fully powered on, fully executed and/or another function) while also performing the one or more operations described herein. It should be appreciated that such simultaneous multi-operational execution is beyond the capability of a human mind.

What is claimed is:

1. A low noise amplifier cryogenic quantum computing device, comprising:

a transistor structure configured to operate in a cryogenic environment, comprising:

a source electrode and drain electrode coupled to a top surface of a high-electron-mobility transistor (HEMT) heterostructure;

a gate electrode disposed beneath and in contact with an underside of the HEMT heterostructure, the gate electrode being encapsulated within an insulating material and electrically coupled through an encapsulated interconnect to a gate pad disposed on a top surface of the device; and wherein the HEMT heterostructure comprises:

a first plurality of semiconductor layers;

a contact layer adjacent to the first plurality of semiconductor layers;

an intermediate semiconductor layer adjacent to the contact layer;

a channel layer adjacent to the intermediate semiconductor layer; and a second plurality of semiconductor layers adjacent to the channel layer; and wherein the first plurality of semiconductor layers, the contact layer, and the channel layer are comprised of materials selected to maintain carrier mobility at cryogenic temperatures.

2. The device of claim 1, wherein the gate electrode is coupled to an encapsulated electrical interconnect and the encapsulated electrical interconnect is coupled to a gate pad.

3. The device of claim 1, wherein the second plurality of semiconductor layers comprises:

a gate barrier layer adjacent to the channel layer; and a semiconductor layer adjacent to the gate barrier layer.

4. The device of claim 3, wherein the gate electrode is in contact with the semiconductor layer of the underside of the HEMT heterostructure.

5. The device of claim 1, wherein the first plurality of semiconductor layers is removed to expose the contact layer.

6. The device of claim 5, wherein the source electrode and the drain electrode are coupled to the contact layer, wherein there is a gap in a center of the contact layer.

7. The device of claim 1, wherein the first plurality of semiconductor layers and the intermediate semiconductor layer comprise an indium phosphide binary semiconductor.

8. The device of claim 1, wherein the second plurality of semiconductor layers comprises an indium gallium arsenide alloy semiconductor.

9. The device of claim 1, further comprising:

one or more alignment markers located in contact with the underside of the HEMT heterostructure, the alignment markers configured to enable lithographic alignment after substrate inversion.

10. A method, comprising:

coupling a source electrode and a drain electrode to a top surface of a high-electron-mobility transistor (HEMT) heterostructure; and positioning a gate electrode in contact with an underside of the HEMT heterostructure, the gate electrode being encapsulated within an insulating material and electrically coupled through an encapsulated interconnect to a gate pad disposed on a top surface of the device; and wherein the HEMT heterostructure comprises:

a first plurality of semiconductor layers;

a contact layer adjacent to the first plurality of semiconductor layers;

an intermediate semiconductor layer adjacent to the contact layer;

a channel layer adjacent to the intermediate semiconductor layer; and a second plurality of semiconductor layers adjacent to the channel layer; and wherein the first plurality of semiconductor layers, the contact layer, and the channel layer are comprised of materials selected to maintain carrier mobility at cryogenic temperatures.

11. The method of claim 10, further comprising:

coupling an electrical interconnect to the gate electrode, wherein the electrical interconnect and the gate electrode are encapsulated; and coupling a gate pad to the electrical interconnect.

12. The method of claim 10, wherein the HEMT heterostructure comprises:

a first plurality of semiconductor layers;

a contact layer adjacent to the first plurality of semiconductor layers;

an intermediate semiconductor layer adjacent to the contact layer;

a channel layer adjacent to the intermediate semiconductor layer; and a second plurality of semiconductor layers adjacent to the channel layer.

13. The method of claim 12, wherein the second plurality of semiconductor layers comprises:

a gate barrier layer adjacent to the channel layer; and a semiconductor layer adjacent to the gate barrier layer.

14. The method of claim 12, further comprising:

removing the first plurality of semiconductor layers to expose the contact layer.

15. The method of claim 14, further comprising:

removing a center of the contact layer two create a first contact and a second contact, wherein the source electrode is coupled to the first contact and the drain electrode is coupled to the second contact.

16. The method of claim 10, further comprising:

positioning one or more alignment markers in contact with the underside of the HEMT heterostructure.

17. A low noise amplifier cryogenic quantum computing device, comprising:

a transistor structure comprising:

a gate electrode; and a semiconductor structure region comprising:

a barrier region on top of the gate electrode;

a channel region configured to carry a current on top of the barrier region;

a source electrode and a drain electrode located on top of the channel region;

wherein the gate electrode is encapsulated within an insulating material and electrically coupled through an encapsulated interconnect to a gate pad disposed on a top surface of the device; and wherein the transistor structure comprises:

a first plurality of semiconductor layers;

a contact layer adjacent to the first plurality of semiconductor layers;

an intermediate semiconductor layer adjacent to the contact layer;

a channel layer adjacent to the intermediate semiconductor layer; and a second plurality of semiconductor layers adjacent to the channel layer; and wherein the first plurality of semiconductor layers, the contact layer, and the channel layer are comprised of materials selected to maintain carrier mobility at cryogenic temperatures.

18. The device of claim 17, wherein the gate electrode is coupled to an encapsulated electrical interconnect and the encapsulated electrical interconnect is coupled to a gate pad, wherein the encapsulated interconnect extends through the heterostructure to the gate pad, the interconnect being surrounded by an oxide encapsulation.

19. The device of claim 17, further comprising:

one or more alignment markers located under the barrier region, the alignment markers configured to facilitate lithographic alignment during fabrication of the cryogenic device.

* * * * *